United States Patent
Hong

(10) Patent No.: US 11,250,907 B2
(45) Date of Patent: *Feb. 15, 2022

(54) VARIABLE DELAY WORD LINE ENABLE

(71) Applicant: Taiwan Semiconductor Manufacturing Company, Ltd., Hsinchu (TW)

(72) Inventor: Hyunsung Hong, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/081,214

(22) Filed: Oct. 27, 2020

(65) Prior Publication Data

US 2021/0043249 A1 Feb. 11, 2021

Related U.S. Application Data

(63) Continuation of application No. 16/171,909, filed on Oct. 26, 2018, now Pat. No. 10,892,007.

(60) Provisional application No. 62/725,727, filed on Aug. 31, 2018.

(51) Int. Cl.
  *G11C 11/418* (2006.01)
  *G11C 11/412* (2006.01)
  *G11C 11/419* (2006.01)

(52) U.S. Cl.
  CPC .......... *G11C 11/418* (2013.01); *G11C 11/412* (2013.01); *G11C 11/419* (2013.01)

(58) Field of Classification Search
  CPC .... G11C 11/418; G11C 11/412; G11C 11/419
  USPC ................... 365/156, 154, 185.23
  See application file for complete search history.

(56) References Cited

U.S. PATENT DOCUMENTS

| | | | |
|---|---|---|---|
| 5,682,353 A * | 10/1997 | Eitan .................. | G11C 7/06 365/185.21 |
| 6,226,754 B1 | 5/2001 | Ware et al. | |
| 7,379,375 B1 | 5/2008 | Peng | |
| 8,315,085 B1 | 11/2012 | Chang et al. | |
| 9,786,363 B1 * | 10/2017 | Hong .................. | G11C 11/419 |
| 10,892,007 B2 * | 1/2021 | Hong .................. | G11C 11/419 |
| 2004/0190352 A1 | 9/2004 | Watanabe et al. | |
| 2005/0122810 A1 | 6/2005 | Lee | |
| 2006/0050569 A1 * | 3/2006 | Shimizu .................. | G11C 7/14 365/189.02 |
| 2008/0106960 A1 | 5/2008 | Goetz et al. | |
| 2013/0155758 A1 | 6/2013 | Liu et al. | |
| 2018/0203796 A1 | 7/2018 | Park et al. | |
| 2019/0392891 A1 * | 12/2019 | Hong .................. | G06F 13/4282 |

OTHER PUBLICATIONS

German Office Action for Application No. 10 2018 128 927.8 dated Apr. 8, 2019.

* cited by examiner

*Primary Examiner* — Connie C Yoha

(74) *Attorney, Agent, or Firm* — Merchant & Gould P.C.

(57) ABSTRACT

A memory device includes a bit line precharge circuit configured to precharge bit lines of a memory array in response to a clock pulse. A controller is configured to output the clock pulse to the bit line precharge circuit, and to output a first word line enable signal to a word line driver. The first word line enable signal is delayed by a first delay time from the clock pulse, and a second word line enable signal is delayed by a second delay time from the clock pulse.

20 Claims, 11 Drawing Sheets

US 11,250,907 B2

VARIABLE DELAY WORD LINE ENABLE

CROSS-REFERENCE TO RELATED APPLICATION

This application is a continuation of U.S. patent application Ser. No. 16/171,909, filed Oct. 26, 2018, which claims the benefit of U.S. Provisional Patent Application No. 62/725,727, filed on Aug. 31, 2018, in which the disclosure of each is incorporated herein by reference in its entirety.

BACKGROUND

A common type of integrated circuit memory is a static random access memory (SRAM) device. A typical SRAM memory device has an array of memory cells. In some examples, each memory cell uses six transistors connected between an upper reference potential and a lower reference potential (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines. In a read operation, for example, the memory cell bit lines are precharged to a predefined threshold voltage. When the word line is enabled, a sense amplifier connected to the bit lines senses and outputs stored information.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
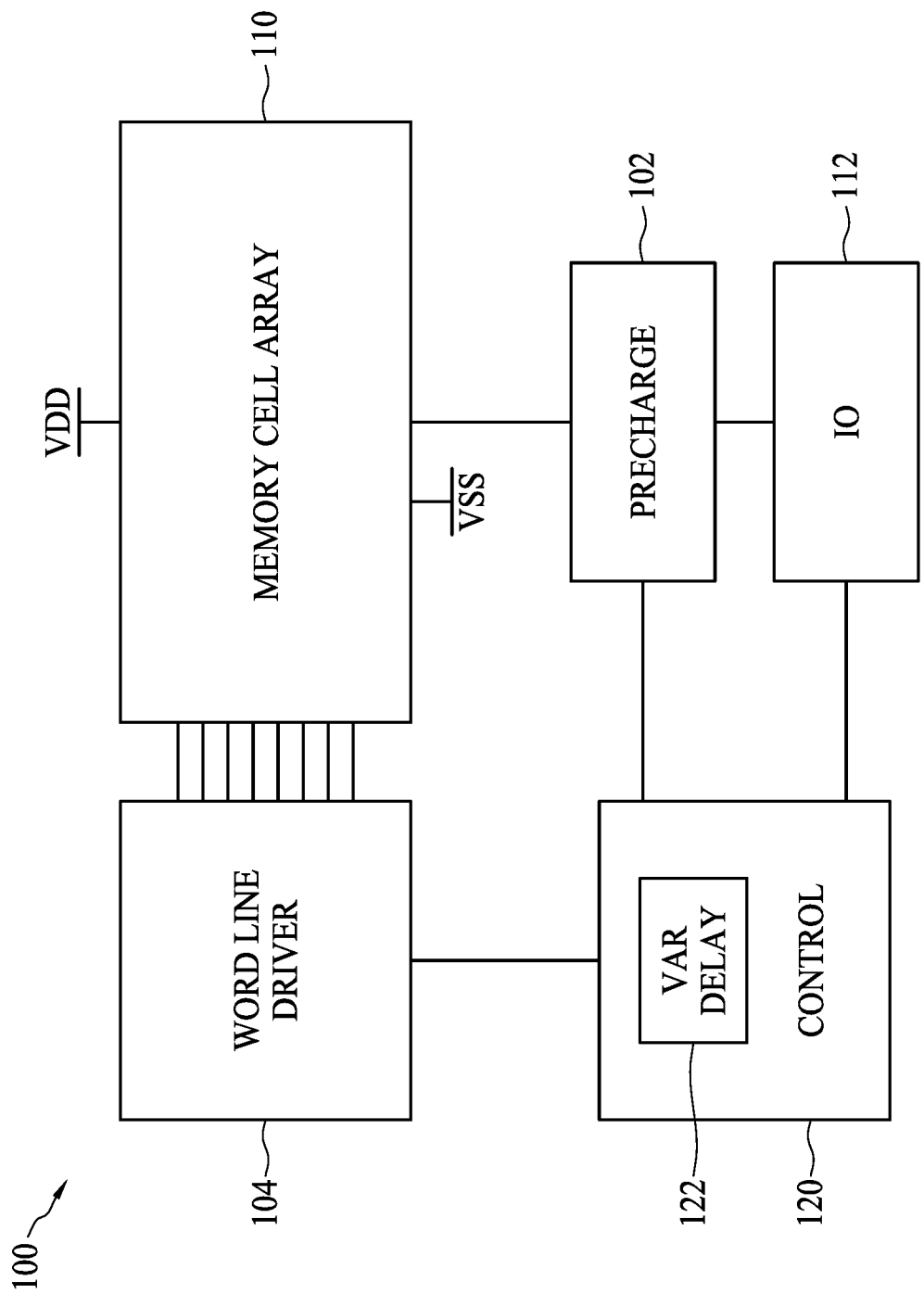
FIG. 1 is a block diagram illustrating an example of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram illustrating an example of a memory device 100 in accordance with aspects of the present disclosure. In the illustrated embodiment of FIG. 1, the memory device 100 includes a memory cell array 110 that includes an array of memory cells. In examples disclosed herein, the memory cells are SRAM cells, though other implementations are possible, such as dynamic random access memory (DRAM) cells. The memory array 110 is connected between an upper reference voltage terminal VDD and a lower reference voltage terminal VSS (typically ground). The memory device 100 further includes an input/output (IO) block 112 configured to read and write data from and to the memory array 110, and a precharge circuit 102 configured to precharge the bit lines of the memory cells of the memory array 110 as will be discussed further below. A word line driver 104 outputs row select signals to select rows of memory cells for reading or writing data. A control block 120 controls the bit line precharge 102 and IO block 112. Additionally, the control block 120 includes a variable delay circuit 122 configured to selectively delay word line enable signals sent to the word line driver 104. Although, in the illustrated embodiment of FIG. 1, each component is shown as a separate block for the purpose of illustration, in some other embodiments, some or all of the components shown in FIG. 1 may be integrated together.

In some examples, each memory cell uses six transistors connected between the upper reference potential VDD and the lower reference potential VSS (typically ground) such that one of two storage nodes can be occupied by the information to be stored, with the complementary information stored at the other storage node. Each bit in the SRAM cell is stored on four of the transistors, which form two cross-coupled inverters. The other two transistors are connected to the memory cell word line to control access to the memory cell during read and write operations by selectively connecting the cell to its bit lines. In a read operation, for example, the memory cell bit lines are precharged to a predefined threshold voltage by the precharge circuit 102. When the word line is enabled by the word line driver 104, a sense amplifier of the IO block 112 connected to the bit lines senses and outputs stored information.

Figure 2:
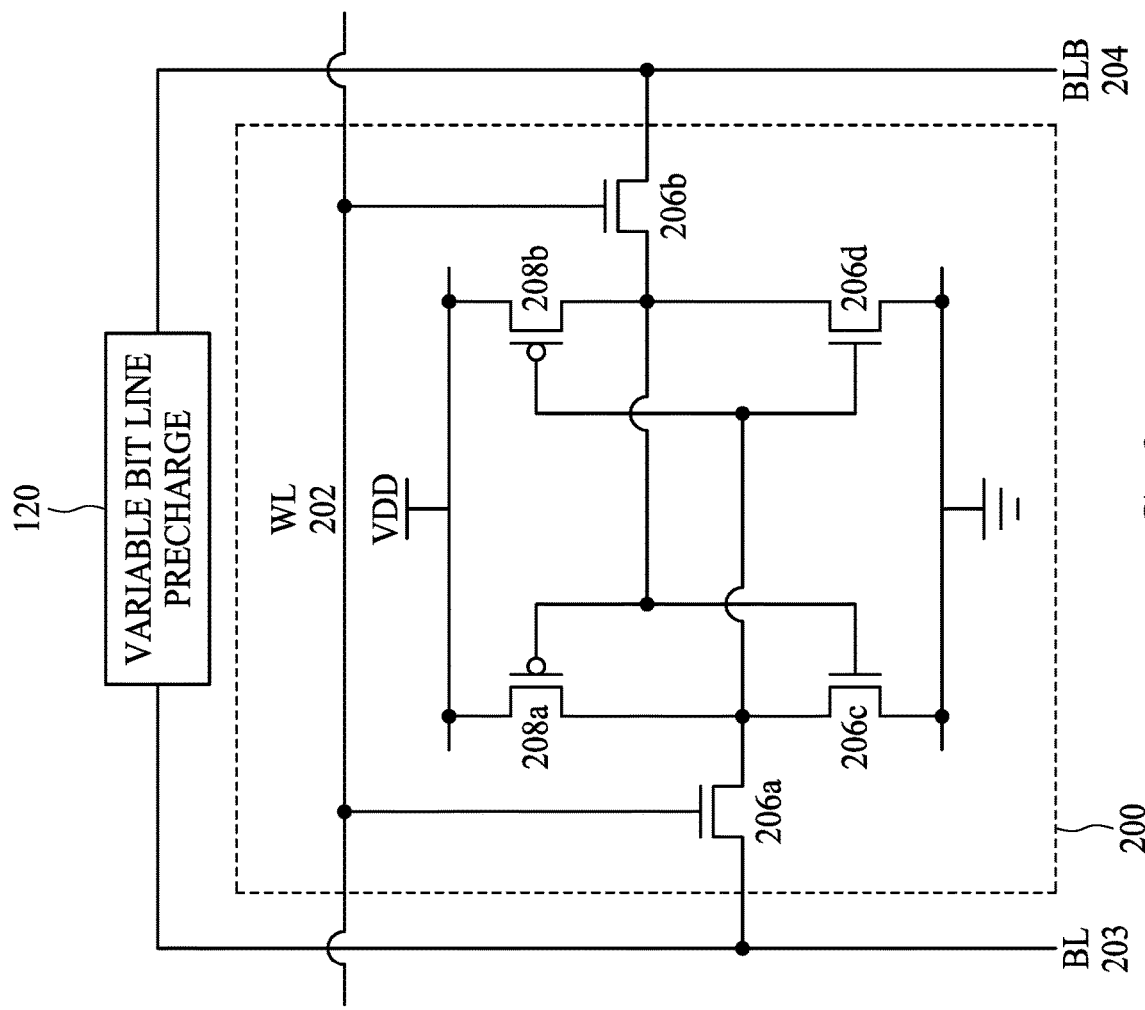
FIG. 2 is a circuit diagram illustrating an example of a static random access memory (SRAM) cell of the memory device shown in FIG. 1 in accordance with some embodiments.

FIG. 2 illustrates an example of a memory cell 200 of the memory cell array 110 shown in FIG. 1. The memory cell 200 is connected to a word line 202 and complementary bit lines BL 203 and BLB 204. The memory cell 200 includes PMOS transistors 208a-b and NMOS transistors 206a-d. The transistors 208a and 206c are coupled to one another and positioned between the supply voltage VDD and ground to form an inverter. Similarly, the transistors 208b and 206d are coupled between VDD and ground to form a second inverter.

The two inverters are cross-coupled to each other. An access transistor 206a connects the output of the first inverter to the bit line BL 203 in response to an enable signal output by the word line driver 104. Similarly, the access transistor 206b connects the output of the second inverter to the bit line bar 204. The word line 202 is attached to the gate controls of the access transistors 206a and 206b to selectively couple the outputs of the inverters to the bit lines 203, 204 during read/write operations in response to the word line driver 104 shown in FIG. 1. During a read operation the inverters drive the complementary voltage levels at the bit lines 203, 204.

The cross coupled inverters of the memory cell 200 provide two stable voltage states denoting logic values 0 and 1. Metal-Oxide Semiconductor Field Effect Transistors (MOSFETs) are typically used as the transistors in the memory cell 200. In some embodiments more or fewer than 6 transistors may be used to implement the memory cell 200. The bit line precharge circuit 102 is connected to the bit lines 203, 204.

Figure 3:
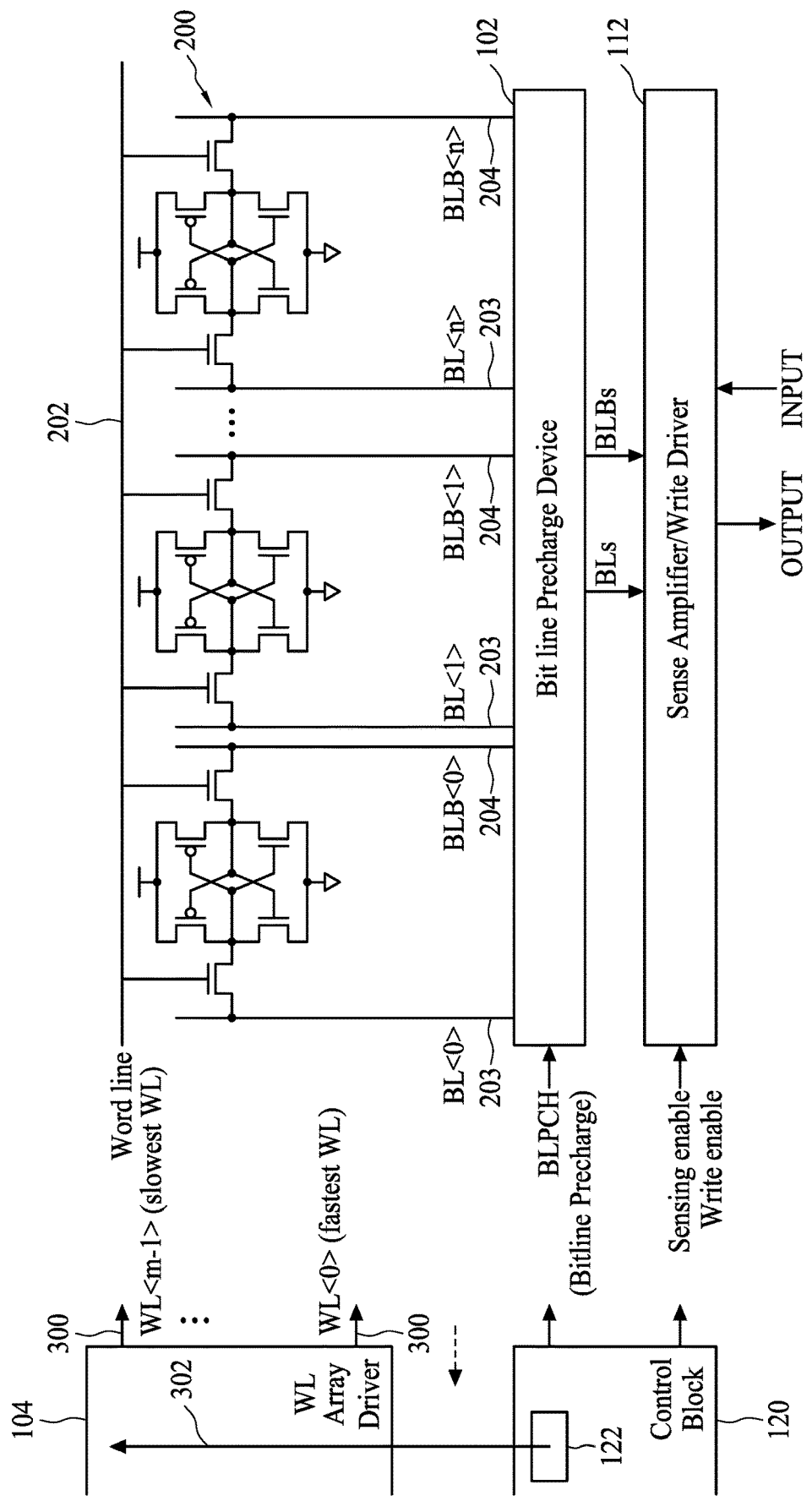
FIG. 3 is a circuit diagram illustrating further aspects of the memory device shown in FIG. 1 in accordance with some embodiments.

FIG. 3 illustrates further aspects of the memory device 100. In some embodiments, the memory cell array 110 includes a plurality of the memory cells 200 arranged in a column-row configuration in which each column has a bit line 203 and a bit line bar 204, and each row has a word line 202. More specifically, the bit lines 203,204 of each column are respectively coupled to a plurality of the memory cells 200 that are disposed in that column, and each memory cell 200 in that column is arranged on a different row and coupled to a respective (different) word line 202. That is, each memory cell 200 of the memory cell array 110 is coupled to a bit line 203 of a column of the memory cell array 110, a bit line bar 204 of the column of the memory cell array 110, and a word line 202 of a row of the memory cell array 110. In some embodiments, the bit lines 203 and bit lines bar 204 are arranged in parallel vertically and the word lines 202 are arranged in parallel horizontally (i.e., perpendicular to the bit lines 203, 204. In the example of FIG. 3, there are n columns and m rows of memory cells 200 in the array 110.

In a read cycle of some embodiments both bit lines 203, 204 are precharged to a high (logic 1) voltage, which is typically at or near the VDD voltage. In response to an enable signal output by the control block 120 via the variable delay circuit 122 (discussed further below), row select signals 300 are output by the word line driver 104 to select the desired word lines 202 of the memory cells 200. The asserted word lines 202 enable the access transistors 206a, 206b of the memory cells 200 coupled to the selected word lines 202. This causes the voltage signal on one of the bit lines 203, 204 to slightly drop. The bit lines 203, 204 will then have a small voltage difference between them. A sense amplifier of the IO block 112 will sense which of the bit lines 203, 204 has the higher voltage and thus determine whether there was 1 or 0 stored by the memory cell 200. In a write cycle, the value to be written to the memory cell 200 is received by the IO block. The desired word lines 202 are asserted in response to the select signals output by the word line driver 104 based on the enable signals from the control bock 120.

For best operation of the memory array 100, the bit lines 203, 204 should be fully precharged before the word lines 202 are asserted for read or write operations. For instance, if the word line 202 is asserted before the bit lines 203, 204 are adequately precharged to the desired precharge voltage level, the read and write operations could result in data errors. Further, the control block 120 outputs precharge and word line enable signals based on a common clock pulse. Thus, to insure proper precharging of the bit lines 203, 204 before asserting the word lines 202, the control block 120 includes a variable delay circuit 122 to delay the word line select signals 300 until after the bit lines 203, 204 are precharged.

With known memory devices, the word line select signals 300 output to all of the word lines 202 are delayed by a single predetermined delay time period. However, memory arrays such as the memory array 110 are often large, resulting in word lines 202 at the upper end of the array 110 being considerably farther from the control block 120 than word lines 202 at the lower and of the array 110, adjacent the control block 120. Thus, as shown in FIG. 3, the word line WL<0> immediately adjacent the control block 120 is closer to the control block 120 than the uppermost word line WL<m−1>. Word line enable signals indicated by the arrow 302 in FIG. 3 travel farther to reach word lines 202 at the upper portion of the memory array 110 (such as the word line WL<m−1>) than the signals 302 have to travel to reach the closer word lines 202 (such as the word line WL<0>). Because of the additional distance, the word line enable signals 302 take longer to reach the word line WL<m−1>, or are "slower." On the other hand, the enable signals 302 reach the close word line WL<0> faster. If all of the word line enable signals 302 are delayed the same, as in known memory systems, performance of the memory device 100 is degraded because the access time for the slow word lines 202 (located farther from the control block) are delayed more than is necessary.

In accordance with aspects of this disclosure, a variable delay circuit 122 varies the delay time period the word line enable signals 302 output to the word line driver 104 by the control block 120 based on the address of the selected word lines 202. In other words, to insure the bit line precharge circuit 102 is able to fully precharge the bit lines 203, 204 before asserting the selected word lines 202, word lines 202 with a low address such as the word line WL<0>, which is closer to the control block 120, are delayed for a first delay time. Since the signals 302 take longer to reach the word lines 202 at the upper end of the array 110, such as the word line WL<m−1>, a certain amount of delay time is "built in" due to the additional time it takes to reach the location of the word line WL<m−1>. Accordingly, the word line enable signals 302 sent to "slower" word lines such as the word line WL<m−1> are delayed for a second delay time period that is less than the first delay time period. The shorter delay time period for the word line WL<m−1> together with the additional signal propagation time required for the additional distance to reach the word line WL<m−1> result in sufficient time to precharge the bit lines 203, 204, without including excess time.

Figure 4:
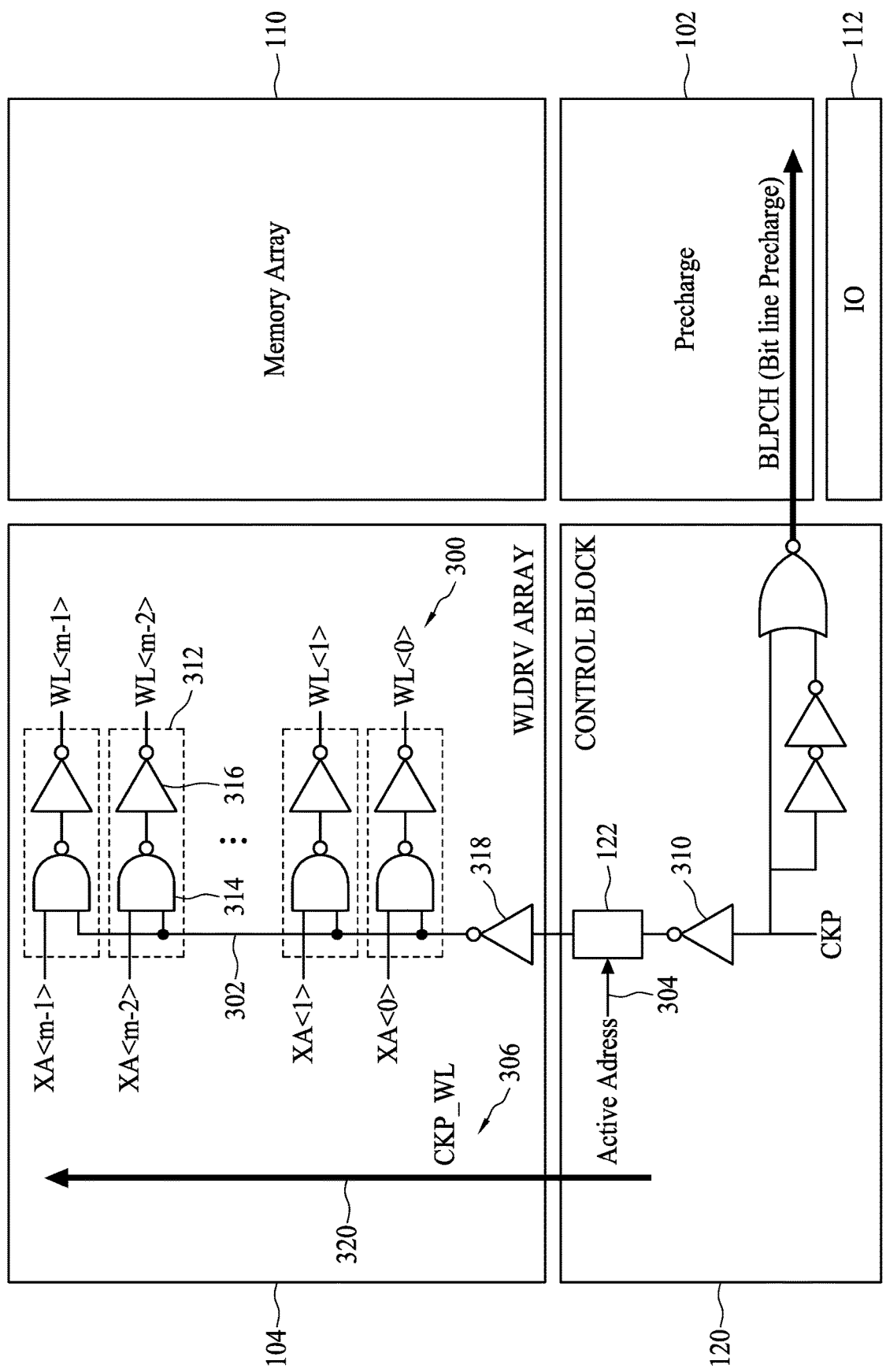
FIG. 4 is a circuit diagram illustrating further aspects of the memory device shown in FIG. 3 in accordance with some embodiments.

FIG. 4 is a circuit diagram illustrating further aspects of the memory device 100, and more particularly, an example of the controller or control block 120 and word line driver 104. The control block 120 outputs a bit line precharge signal BLPCH based on a clock pulse CKP. The precharge circuit 102 applies a voltage to the bit lines 203, 204 in response to the BLPCH signal to precharge the bit lines 203, 204.

The variable delay device 122 receives the clock pulse CKP via an inverter 310. Further, the variable delay device 122 receives an address input signal 304 identifying cells 200 in the array 110 for reading or writing data. Based on the address signal 304, row address signals 306 are received by row select circuit 312 of the appropriate word line driver 104, which outputs the row select signals 300 to the corresponding word lines 202. The row select circuits 312 each include a NAND gate 314 that receives a row address signal 306 at one input, and the enable signal 302 at its other input. The output of the NAND gates 314 is received by an inverter 316 that outputs the row or word line select signals 302 to the corresponding word lines 202 of the memory array 110.

As indicated by the arrow 320, the word lines 202, and thus the row select circuits 312 outputting the row select signals 300 having higher addresses are physically located farther away from the control block 120. Since the enable signals 302 have to travel farther from the control block 120, the enable signals 302 for these higher address rows are delayed less to account for the inherent delay due to the location farther from the control block 120. As noted above, these word lines 202 are referred to as "slow" word lines.

Figure 5:
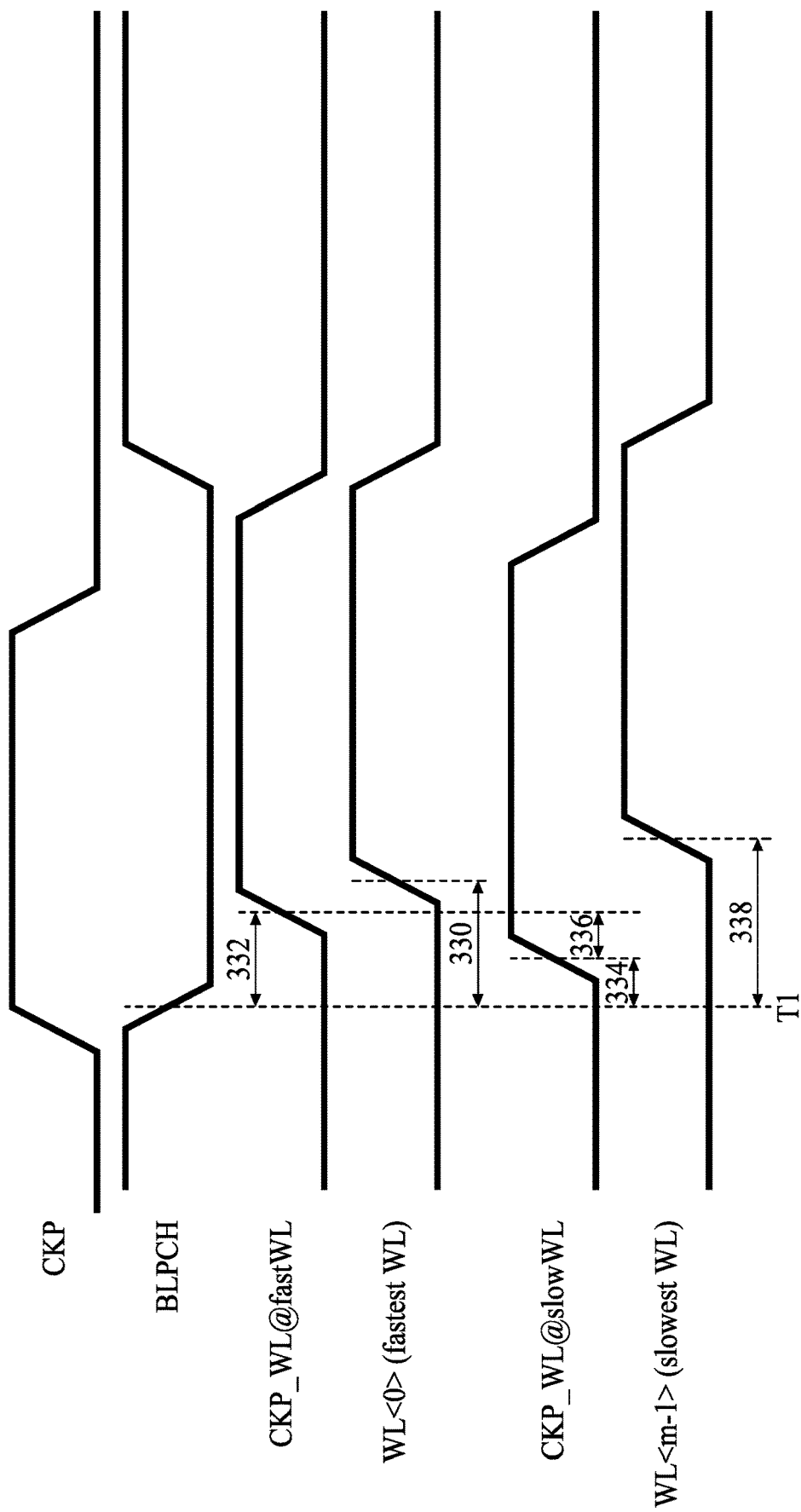
FIG. 5 is a timing diagram illustrating examples of wave forms of the memory device shown in FIG. 4 in accordance with some embodiments.

FIG. 5 is a timing diagram illustrating an example of signals output by the embodiment shown in FIG. 4. At a time T1 the clock signal CKP goes high, causing the bit line precharge signal BLPCH to go low and precharge the bit lines 203, 204. A minimum delay period 330 is the delay time required for the bit lines 203, 204 to sufficiently precharge before outputting the row select signals 300 to assert the desired word lines 202 of the memory array 110. To achieve this timing for the fast word lines (i.e. the word lines 202 closer to the control block 120), the word line enable signal 302 for the fast word lines CKP_WL@fastWL is delayed by a first time period 332. This results in the word line select signal 300 for the fast word line WL<0> going high following the minimum delay time 330.

Since the enable signal 302 takes longer to reach the slow word lines, such as the word line WL<m−1>, the word line enable signal 302 for the slow word lines CKP_WL@slowWL is delayed by a second delay period 334, which is less than the first delay time period 332 by a time period 336. The second delay period 334 together with the additional time required for the enable signal 302 to travel the farther distance to the word line WL<m−1> results in the word line select signal 300 for the slow word line WL<m−1> going high following a delay period 338. The slow word line WL<m−1> goes high only slightly after the fast word line WL<0> due to the shortened second delay time period 334.

Figure 6:
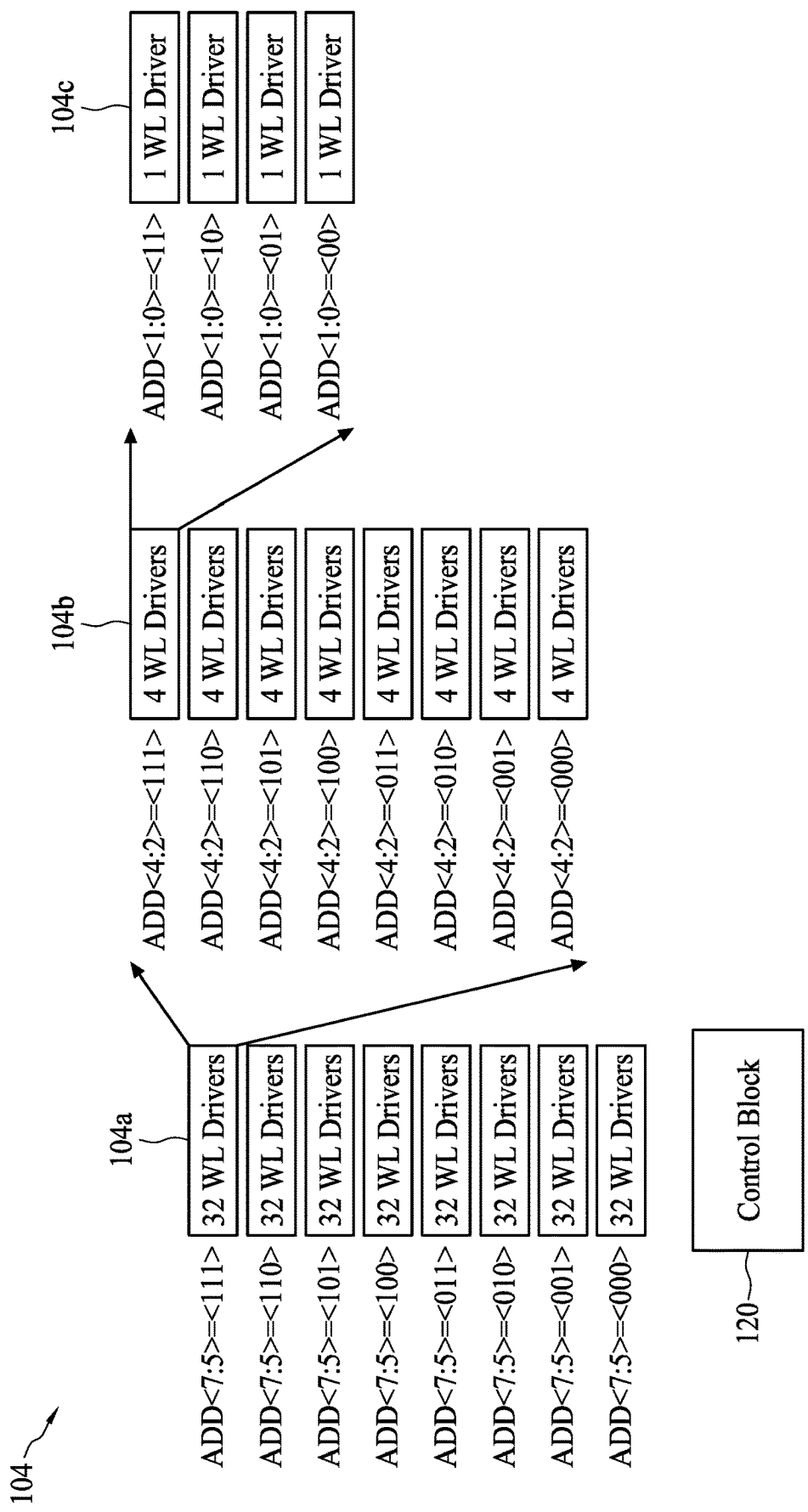
FIG. 6 is a block diagram illustrating an example of segmenting word line drivers of the memory device of FIG. 3 in accordance with some embodiments.

In some examples, the row addresses are divided into a plurality of segments based on their physical distance from the control block 120. FIG. 6 illustrates an example of segmenting the word lines 202 and associated word line drivers 104 based on distance of the word lines 202 from the control block 120. In the illustrated example, the memory cell array 110 has 256 rows. Other examples may have more or fewer rows. Thus, an 8-bit address is used to identify the appropriate word line 202 and corresponding word line driver 104. As shown in the example of FIG. 6, the three leftmost bits of the address ADD<7:5> segment the word line array 104 into eight groups of 32 word line drivers and corresponding word lines. The higher addresses identify word lines farther from the control block 120 as shown in FIG. 6. The word line address ADD<7:5>=111 thus identifies uppermost group 104a of 32 word line drivers. The next three address bits ADD<4:2> break the 32 word line drivers of the ADD<7:5>=111 group 104a into eight sub-groups of four word line drivers each. Finally, the last two address bits ADD<1:0> identify the specific word line drivers of the ADD<4:2> sub-groups. Thus, the word line sub-group address ADD<4:2>=111 identifies the uppermost sub-group 104b of the group 104a word line drivers, and the rightmost group of addresses 104c in FIG. 6, ADD<1:0>=00-11 identify the specific word line drivers of the sub-group 104b. Thus, by considering the three leftmost bits of the word line address ADD<7:5>, a memory array having 256 row addresses could be segmented into eight segments of 32 word lines each (group 104a). By considering the six leftmost bits of the word line address ADD<7:2> (groups 104a and 104b together), the memory array could be segmented into 64 segments of four word lines each. Moreover, by considering, for example, the four leftmost bits of the word line address ADD<7:4>, the memory array could be segmented into 16 segments of 16 word lines each, and so on. Accordingly, a memory array having 256 word lines could be segmented as follows.

| Word line address | Segments | Word lines per segment |
|---|---|---|
| ADD<7> | 2 | 128 |
| ADD<7:6> | 4 | 64 |
| ADD<7:5> | 8 | 32 |
| ADD<7:4> | 16 | 16 |
| ADD<7:3> | 32 | 8 |
| ADD<7:2> | 64 | 4 |
| ADD<7:1> | 128 | 2 |

Figure 7:
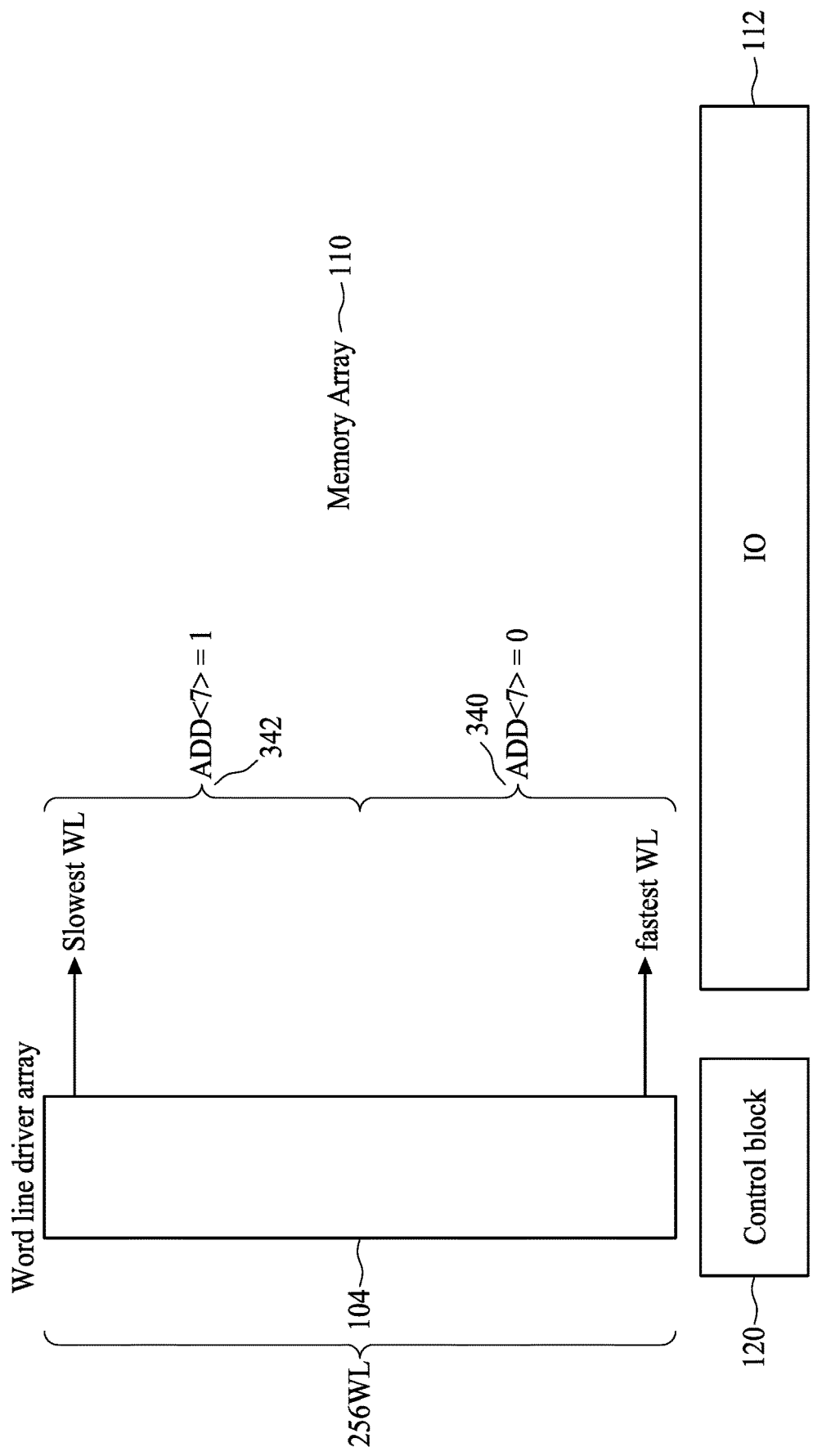
FIG. 7 is a block diagram illustrating further aspects of the example of a word line driver of the memory device of FIG. 3 in accordance with some embodiments.

FIG. 7 illustrates an example where only the leftmost bit ADD<7> is considered to segment the memory array 110 into two segments of 128 word lines each. The two segments include a first segment 340 of fast word lines (closer to the control block 120) that are signified by ADD<7>=0, and a second segment 342 of slow word lines (farther from the control block 120) signified by ADD<7>=1. In other embodiments, more than two segments may be employed, for example, corresponding to fast, medium, and slow word lines, etc. Further, FIGS. 6 and 7 illustrate example arrays having 256 word lines with an eight-bit word line address. Memory arrays having more or fewer word lines (with word line addresses having more or fewer than eight bits) and corresponding different ways to segment the word lines are within the scope of this disclosure.

In the illustrated example, the memory array 110 includes 256 rows. Thus, the uppermost, slowest word line WL<m−1> has the binary address of 11111111. All of the row addresses in the second (slow) segment 342 have binary addresses equal to or greater than 10000000. Thus, in this example, the address bit ADD<7> determines which segment 340, 342 the selected word line 202 falls into. Accordingly, the first or second delay time period 332 or 334 is determined based on the ADD<7> bit of the row address. In other words, the word line enable signal 302 for rows having ADD<7>=0 (fast rows) are delayed by the first delay period 332, and the word line enable signal 302 for rows having ADD<7>=1 (slow rows) are delayed by the second delay period 334.

Figure 8:
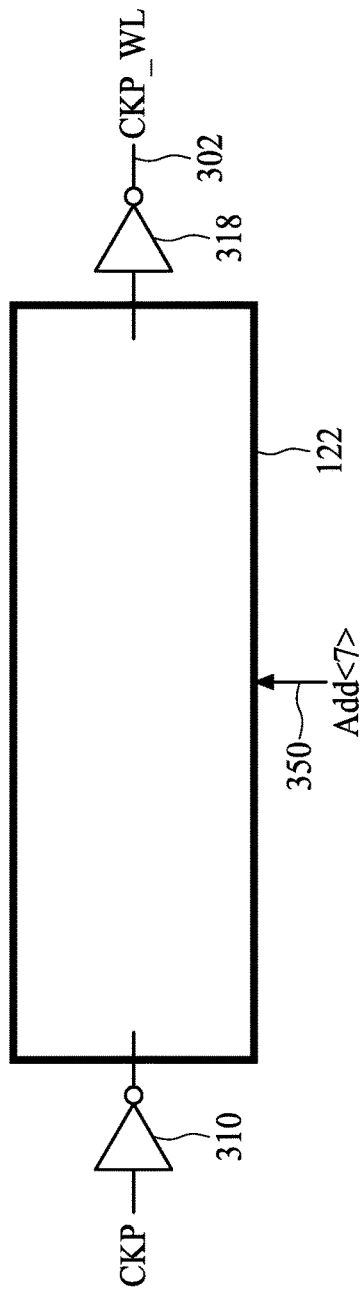
FIG. 8 is a circuit diagram illustrating an example of a variable delay circuit of the memory device of FIG. 3 in accordance with some embodiments.

FIG. 8 illustrates an example of the variable word line delay circuit 122. As noted above, the variable word line delay circuit 122 receives the clock pulse CKP via an inverter 310, and outputs the word line enable signal 302 from an inverter 318. The variable word line delay circuit 122 further includes an address input 350 that receives the ADD<7> row address bit, and based on this input delays the clock pulse CKP by either the first or second delay period 332 or 334. Thus, if the ADD<7> input 350=0 (fast rows), the word line enable signal 302 is delayed by the first delay period 332, and if the ADD<7> input=1 (slow rows) the word line enable signal 302 is delayed by the second delay period 334.

Figure 9:
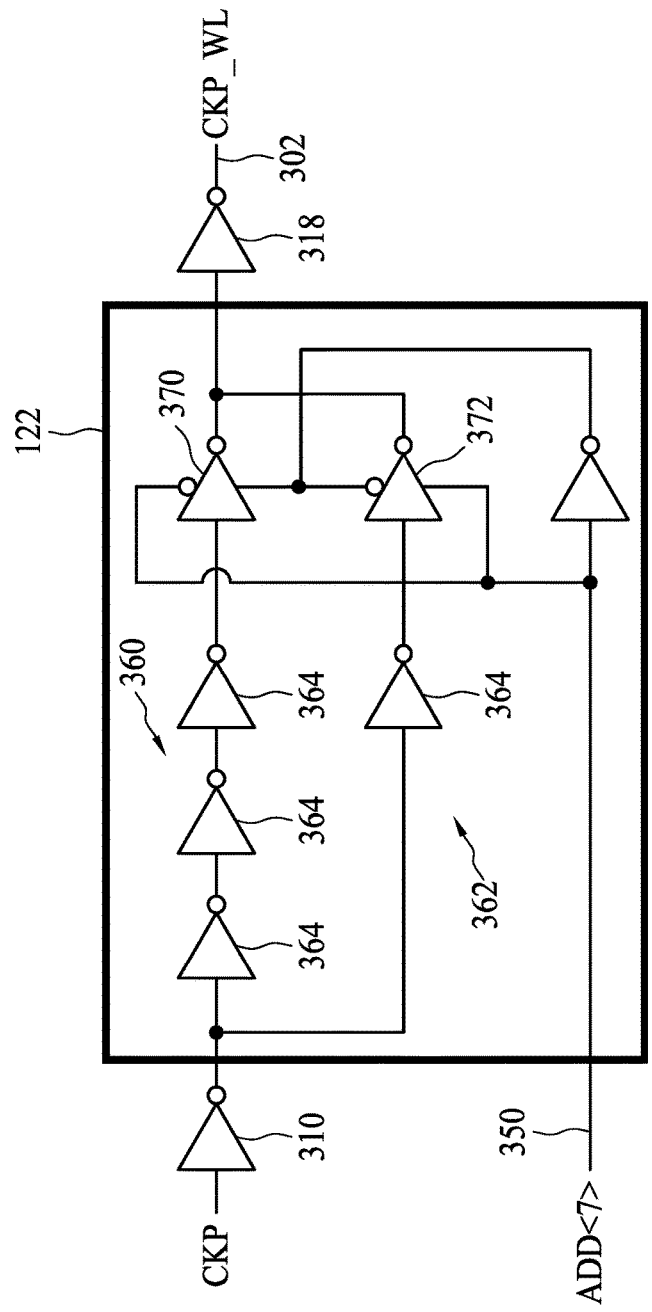
FIG. 9 is a circuit diagram illustrating an example of the variable delay circuit of FIG. 8 in accordance with some embodiments.

FIG. 9 illustrates further aspects of one example implementation of the variable delay circuit 122. The variable delay circuit 122 shown in FIG. 9 includes a first delay element 360 configured to delay the clock pulse 310 by the first (longer) delay period 332 and a second delay element 362 configured to delay the clock pulse 310 by the second (shorter) delay period 334. In the illustrated example, the first delay element 360 made up of three inverters 364, while the second delay element 362 is made up of a single inverter 364. Other delay arrangements are possible. The clock pulse CKP as delayed by the first and second delay elements 360, 362 are applied to respective first and second switches 370, 372 that are operated in response to the ADD<7> signal.

More specifically, in the illustrated example the first delay element 360 applies the delayed clock pulse CKP to a first tri-state inverter 370, and the second delay element 362 applies the delayed clock pulse CKP to a second tri-state inverter 372. In addition to the low and high logic levels, the tri-state inverters 370, 372 allow their output ports to assume a high impedance state, effectively removing the output from the circuit. The ADD<7> input is applied to the select inputs of the tri-state inverters 370, 372 so as to select the first or second delay element 360 or 362 based on the ADD<7> input.

Figure 10:
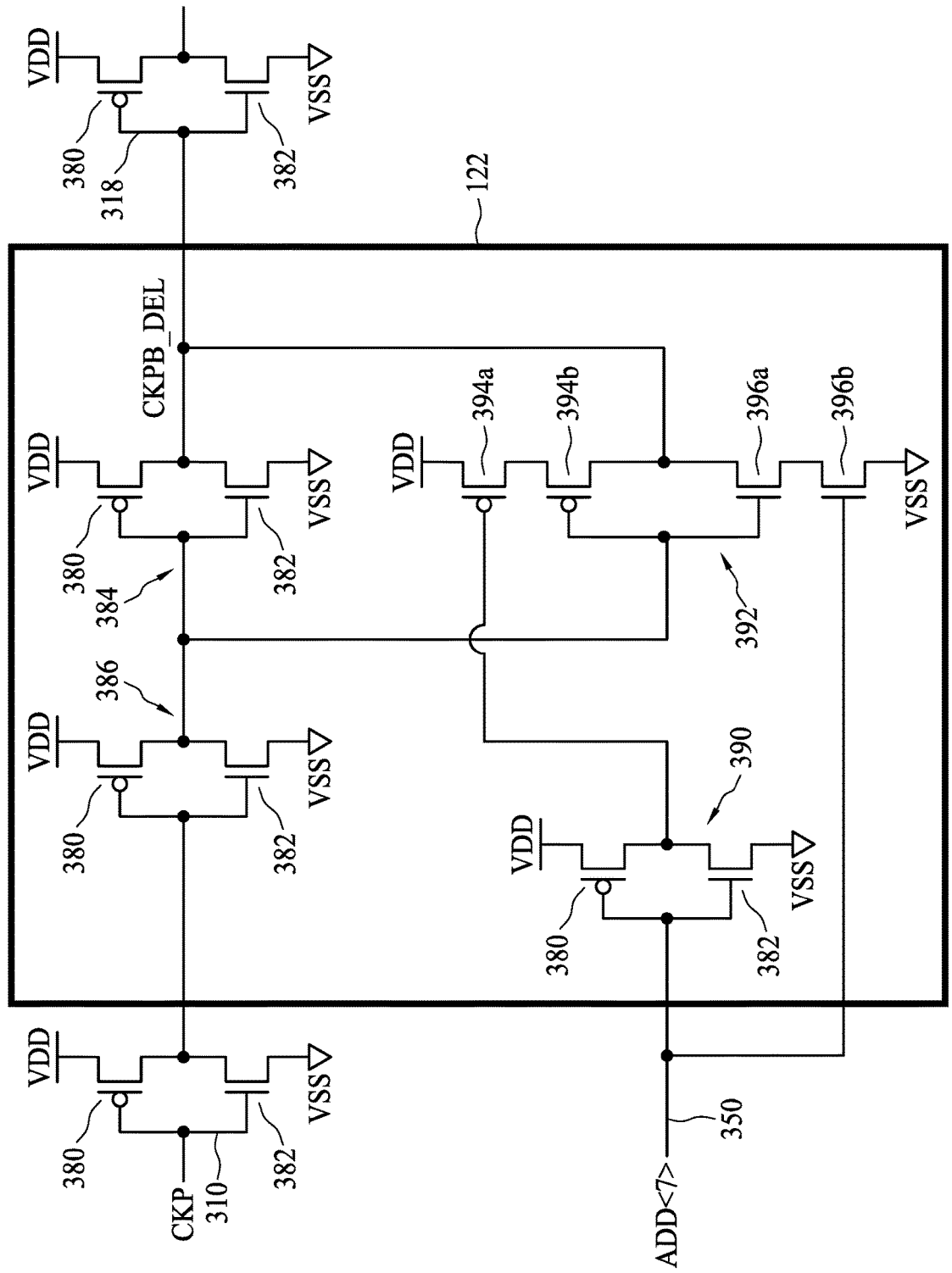
FIG. 10 is a circuit diagram illustrating another example of the variable delay circuit of FIG. 8 in accordance with some embodiments.

FIG. 10 shows another example of the variable delay circuit 122. Two delay elements 384, 386 comprising inverters formed by PMOS transistors 380 and NMOS transistors 382 receive the inverted clock pulse signal CKP, which output the delayed clock pulse CKPB_DEL output by the variable delay circuit 122. The ADD<7> input is received by an inverter 390, such that the ADD<7> input and its complement are applied to an additional delay circuit 392 that includes two series-connected PMOS transistors 394a and 394b, and two series-connected NMOS transistors 396a and 396b connected between the VDD and VSS voltage terminals to form a tri-state inverter. When the ADD<7> signal is high, the transistors 394a and 396b are enabled so that the additional delay circuit 392 provides an output. Thus, the delay element 384 and the additional delay circuit 392 both drive the CKPB_DEL node, resulting in a faster transition of the CKP_WL signal delay the CKP_WL signal less for the slow word lines. The additional delay circuit 392 functions to lengthen the logic transition time of the delayed clock pulse CKPB_DEL, thus increasing the delay time period when the ADD<7> input is 0, so that the first (longer) time delay period 330 is applied for the fast word lines. More particularly, when the ADD<7> input is low, the transistors 394a and 396b are both off, disabling the additional delay circuit 392. Accordingly, only the delay element 384 drives the CKPB_DEL node, which results in a slower transition of the CKPB_DEL output to increase the delay period of the CKP_WL signal for the fast word lines.

Figure 11:
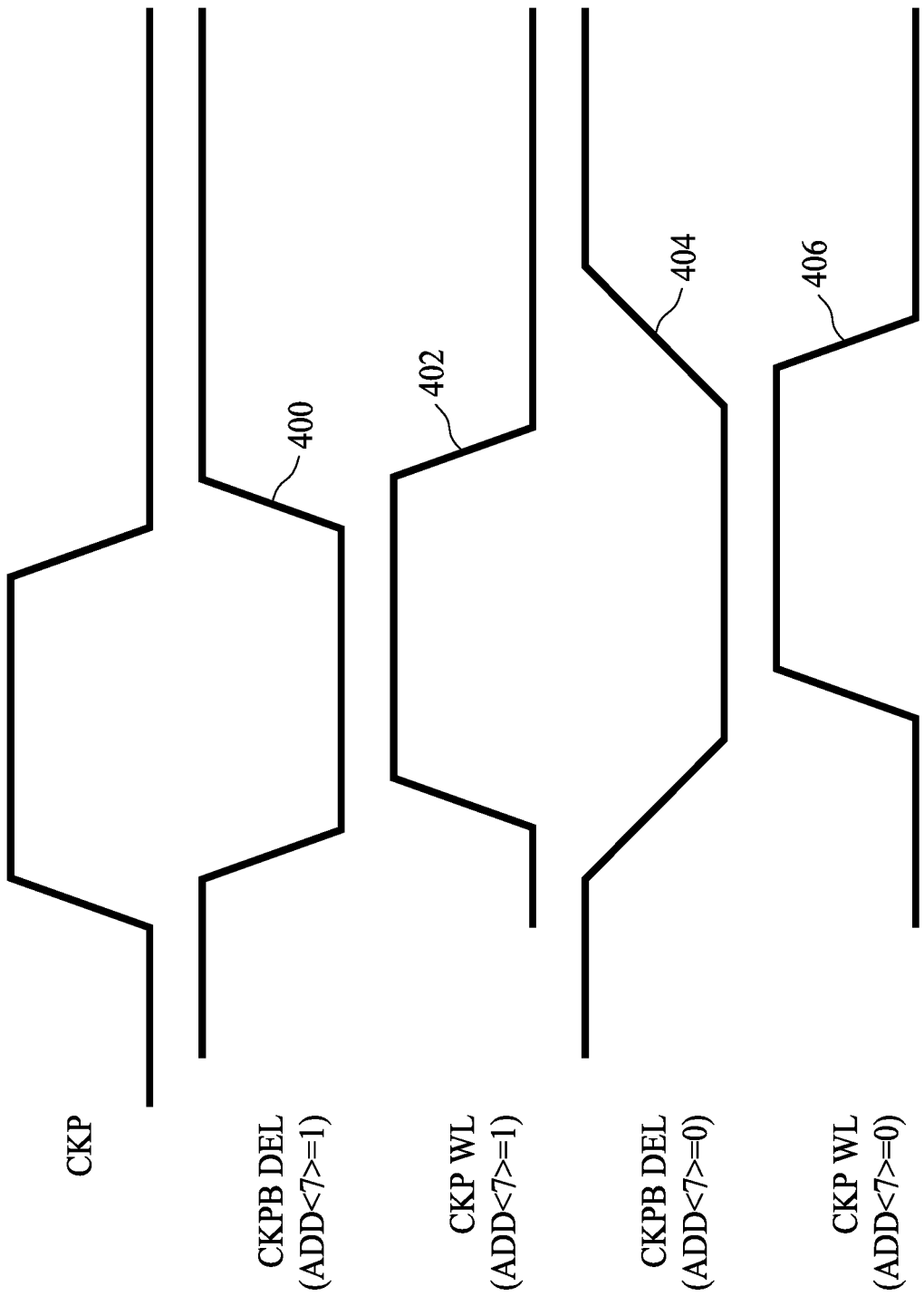
FIG. 11 is a timing diagram illustrating examples of wave forms of the variable delay circuit shown in FIG. 10 in accordance with some embodiments.

FIG. 11 illustrates example wave forms corresponding to the variable delay circuit 122 shown in FIG. 10. In response to the clock pulse CKP going low, the delayed clock pulse CKPB_DEL also goes low. The pulse width is established by the delay elements 384 and 386. When the ADD<7> signal is high—meaning a row address in the upper segment 342 of the memory array 110 has been selected—the delayed clock pulse signal CKPB_DEL quickly transitions from high to low, then from low to high in response to the clock pulse CKP. Thus, the second (shorter) delayed clock pulse CKPB-_DEL is output for the slow word lines as indicated by the first CKPB_DEL wave form 400. The CKPB_DEL signal is inverted by the inverter 380 such that the word line select signal CKP_WL 402 is output as the word line enable signal 302 to the word line driver 104.

When the ADD<7> signal is low, the first (longer) delay time period 332 is required for the fast word lines in the lower segment 340 of the memory array 110. Based on the low ADD<7> signal, the additional delay circuit 392 functions to lengthen the transitions between logic low and high of the delayed clock pulse CKBP_DEL 400, so that the CKPB_DEL signal 404 has flatter transitions as shown in the lower CKPB_DEL 404 wave form for ADD<7>=0 in FIG. 11. The CKPB_DEL signal 404 is inverted by the inverter 380, resulting in the CKP_WL signal 406 that is delayed by the first delay time period 332.

Figure 12:
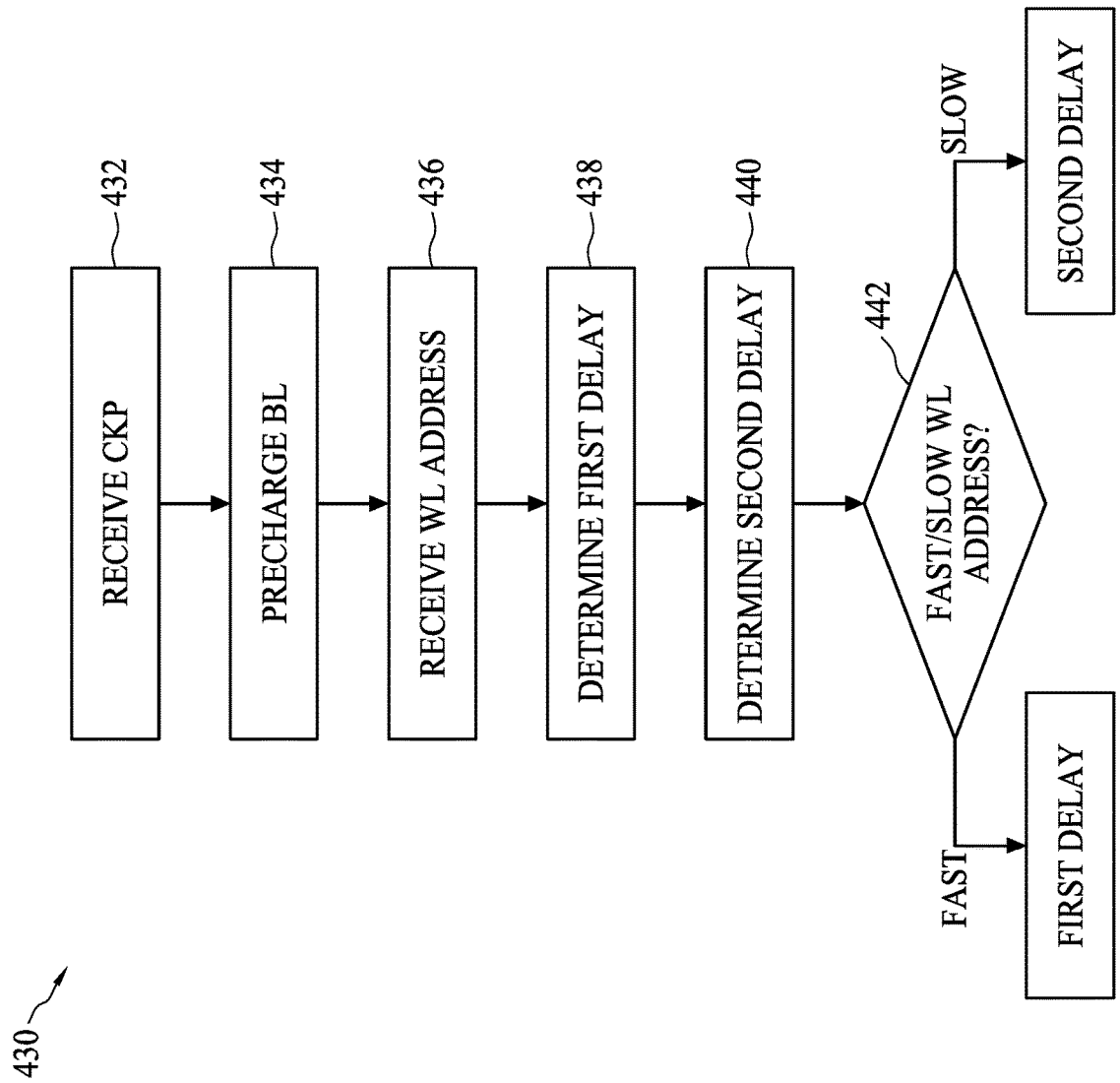
FIG. 12 is a flow diagram illustrating an example of a memory device operation method in accordance with some embodiments.

FIG. 12 is a process flow diagram illustrating an example of a method 430 for operating a memory array, such as the memory array 110 disclosed herein. The method 430 includes receiving the clock pulse CKP at an operation 432. At an operation 434, bit lines 203, 204 of the memory array 110 are precharged based on the clock pulse CKP, and a word line address is received identifying selected rows of the memory array 110 for read or write operations in an operation 436.

Operations 438 and 440 show first and second delay time being determined. As discussed above, a first delay 332 for fast word lines, or those closer to the control block, is longer than a second delay 334 for slower word lines, or those farther from the control block. The first and second delay periods provide sufficient time for the memory array 110 bit lines 203, 204 to precharge before asserting the selected word lines 202. Since it takes longer for the word lines 202 positioned farther from the control block 120 (slow word lines) to receive word line enable signals 302 from the control block 120, the second delay time used for these slow word lines is shorter. Conversely, since the word lines 202 closer to the control block 120 (fast word lines) receive the enable signals 302 faster, the first delay time is longer to insure sufficient time for the bit lines 203, 204 to precharge.

Decision block 442 determines whether the received address is a fast word line (close to the control block 120) or a slow word line (farther from the control block 120). Based on this determination, the first or second delay time is applied to the clock pulse CKP such that a word line select signal is output that is delayed by the first or second delay time in response to the word line address as shown in operations 444 and 446.

Thus, aspects of the present disclosure provide a variable delay for word line enable signal so that the word line enable signals are not delayed more than is necessary. In this manner, performance of the memory device in enhanced. In accordance with disclosed embodiments, a memory device such as an SRAM device includes an array of memory cells. Bit lines and word lines are connected to the memory cells. A bit line precharge circuit is configured to output a precharge signal to the bit line in response to a clock pulse. A word line driver is configured to select predetermined word lines of the array in response to received word line enable signals. A controller is configured to output the clock pulse to the bit line precharge circuit, and to output a first word line enable signal to the word line driver that is delayed by a first delay time from the clock pulse, and a second word line enable signal that is delayed by a second delay time from the clock pulse.

In accordance with further disclosed embodiments, a memory controller includes a word line driver configured to receive a word line address signal and a word line enable signal. A variable delay circuit is configured to receive a clock pulse, and delay the received clock pulse by one of a first delay time and a second delay time in response to the word line address signal. The variable delay circuit outputs the delayed clock pulse signal to the word line driver.

In accordance with still further disclosed embodiments, a method for operating a memory device includes pre-charging a plurality of bit lines of an array of memory cells in response to a clock pulse. A first delay time is determined in response to a first word line address signal, and a second delay time is determined in response to a second word line address signal. A first word line select signal is output in response to the clock pulse delayed by the first delay time, and a second word line select signal is output in response to the clock pulse delayed by the second delay time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
an array of memory cells comprising a plurality of word lines;
a controller configured to:
receive a clock pulse;
receive a first word line address corresponding to a first selected word line of the plurality of word lines;
determine a first delay time corresponding to the first word line address, wherein the controller being configured to determine the first delay time corresponding to the first address comprises the controller being configured to:
determine a first segment corresponding to the first word line address, and
determine a delay time associated with the first segment as the first delay time, wherein a plurality of word line addresses associated with the plurality of word lines are divided into a plurality of segments based on a distance of each of the plurality of word lines from the controller, and wherein each of the plurality of segments are associated with a corresponding delay time; and
output a first word line enable signal to enable the first selected word line, wherein the first word line enable signal is delayed by the first delay time from the clock pulse.

2. The memory device of claim 1, wherein the controller includes a first delay element configured to establish the first delay time.

3. The memory device of claim 2, wherein the first delay element comprises at least one inverter.

4. The memory device of claim 1, wherein the array of memory cells comprises static random access memory cells.

5. The memory device of claim 1, wherein the controller is further configured to:
receive a second word line address corresponding to a second selected word line of the plurality of word lines;
determine a second delay time corresponding to the second word line address, wherein the second delay time is determined based on a second distance of the second selected word line from the controller; and
output a second word line enable signal to enable the second selected word line, wherein the second word line enable signal is delayed by the second delay time from the clock pulse.

6. The memory device of claim 1, wherein the first delay time corresponds to a first range of word line addresses.

7. The memory device of claim 6, wherein the first range of word line addresses includes a first half of the word line addresses of the array of memory cells.

8. A memory device, comprising:
an array of memory cells comprising a plurality of word lines;
a controller configured to:
receive a first address corresponding to a first selected word line of the plurality of word lines,
output a first word line enable signal to enable the first selected word line of the plurality of word lines, wherein the first word line enable signal is delayed by a first delay time from the clock pulse,
receive a second address corresponding to a second selected word line of the plurality of word lines, and
output a second word line enable signal to enable the second selected word line of the plurality of word lines, wherein the second word line enable signal is delayed by a second delay time from the clock pulse, the second delay time being different than the first delay time.

9. The memory device of claim 8, wherein the first delay time and the second delay time are determined based on respective the first address and the second address of the first selected word line and the second selected word line.

10. The memory device of claim 8, wherein the second delay time is shorter than the first delay time, and wherein the second selected word line is farther from the controller than the first selected word line.

11. The memory device of claim 10, wherein the second address is higher than the first address.

12. The memory device of claim 8, wherein the first delay time corresponds to a first range of word line addresses, and the second delay time corresponds to a second range of word line addresses.

13. The memory device of claim 12, wherein the second range of word line addresses is higher than the first range of word line addresses.

14. The memory device of claim 12, wherein the first range of word line addresses includes a first half of the word line addresses of the memory array, and the second range of word line addresses includes a second half of the word line addresses of the memory array.

15. The memory device of claim 8, wherein the controller includes a first delay element configured to establish the first delay time and a second delay element configured to establish the second delay time.

16. The memory device of claim 8, wherein the first delay element and the second delay element each include at least one inverter.

17. The memory device of claim 16, wherein the controller is configured to establish the first delay time by changing a logic transition of the second word line enable signal.

18. A method, comprising:
receiving a clock pulse;
receiving a first word line address corresponding to a first word line of a plurality of word lines of an array of memory cells,
determining that the first word line address belongs to a first range of addresses associated with the plurality of word lines;
determining a first delay time associated with the first range of addresses, wherein a plurality of word line addresses associated with the plurality of word lines are divided into a plurality of range of addresses based on a distance of each of the plurality of word lines from a controller, and wherein each of the plurality of range of addresses are associated with a corresponding delay time;
delaying the received clock pulse by first delay time; and
generating a first word line enable signal to enable the first word line of the plurality of word lines, wherein the first word line enable signal is delayed by the first delay time from the clock pulse.

19. The method of claim 18, further comprising:
dividing a plurality of word line addresses associated with the plurality of work lines of the array of memory cells into a first range of addresses and a second range of addresses.

20. The method of claim 18, further comprising:
receiving a second word line address corresponding to a second word line of the plurality of word lines of the array of memory cells,
determining that the second word line address belongs to a second range of addresses associated with the plurality of word lines;
delaying the received clock pulse by a second delay time in response to determining that the second word line address belongs to a second range of addresses; and
generating a second word line enable signal to enable the second word line of the plurality of word lines, wherein the second word line enable signal is delayed by the second delay time from the clock pulse.

* * * * *